(12) United States Patent
Lamesch

(10) Patent No.: US 11,097,764 B2
(45) Date of Patent: Aug. 24, 2021

(54) SYSTEM FOR HAND DETECTION ON A STEERING WHEEL

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/761,046

(22) PCT Filed: Oct. 29, 2018

(86) PCT No.: PCT/EP2018/079593
§ 371 (c)(1),
(2) Date: May 1, 2020

(87) PCT Pub. No.: WO2019/086388
PCT Pub. Date: May 9, 2019

(65) Prior Publication Data
US 2020/0377137 A1    Dec. 3, 2020

(30) Foreign Application Priority Data

Nov. 3, 2017    (LU) ...................... 100 509

(51) Int. Cl.
*G01R 31/00*    (2006.01)
*B62D 1/04*    (2006.01)
(Continued)

(52) U.S. Cl.
CPC ............ *B62D 1/046* (2013.01); *B60R 16/037* (2013.01); *B62D 1/065* (2013.01); *H03K 17/962* (2013.01)

(58) Field of Classification Search
USPC ........... 324/691–693, 699, 532, 533, 750.12; 219/204; 701/41
See application file for complete search history.

(56) References Cited

U.S. PATENT DOCUMENTS

2011/0190980 A1*    8/2011    Kincaid .................... G06F 7/00
701/36
2014/0151356 A1*    6/2014    Maguire .............. H05B 1/0236
219/204

(Continued)

FOREIGN PATENT DOCUMENTS

DE    112016001183 T5    11/2017
WO    WO2014184743 A1    11/2014
(Continued)

OTHER PUBLICATIONS

International Search Report corresponding to International Application No. PCT/EP2018/079593, dated Feb. 1, 2019, 4 pages.
(Continued)

*Primary Examiner* — Vincent Q Nguyen
(74) *Attorney, Agent, or Firm* — Reising Ethington P.C.

(57) ABSTRACT

A system for hand detection on a steering wheel includes a signal line extending from a first point to a second point and being disposed along at least a portion of a surface of the steering wheel; and a detection unit coupled to the first point. The detection unit is configured to send a time-dependent detection signal over the signal line, receive a reflected signal from the signal line and detect the presence of a hand on the surface based on the reflected signal.

15 Claims, 2 Drawing Sheets

(51) Int. Cl.
*B60R 16/037* (2006.01)
*B62D 1/06* (2006.01)
*H03K 17/96* (2006.01)

(56) References Cited

U.S. PATENT DOCUMENTS

2018/0022374 A1    1/2018  Fujikawa et al.
2018/0327016 A1*  11/2018  Okazaki .................. G01V 3/08

FOREIGN PATENT DOCUMENTS

| WO | WO2016087279 A1 | 6/2016 |
| WO | WO2016147575 A1 | 9/2016 |

OTHER PUBLICATIONS

Written Opinion corresponding to International Application No. PCT/EP2018/079593, dated Feb. 1, 2019, 5 pages.

* cited by examiner

SYSTEM FOR HAND DETECTION ON A STEERING WHEEL

TECHNICAL FIELD

The invention relates a system for hand detection on a steering wheel and to a method for hand detection on a steering wheel.

BACKGROUND

In modern vehicles, it can be necessary to detect whether the driver has his hands on the steering wheel (e.g. in order to determine whether the driver is ready to carry out a steering action). Steering assistants may include an active correction possibility for the driver to be used in certain circumstances. For example, a provision may be made for a steering assistance system to be activated only when the driver has his hands on the steering wheel. In most countries, it is mandatory that the vehicle when moving is under the control of the driver, even if modern assistance systems would be able to safely operate the vehicle in certain situations.

In order to identify whether or not at least one hand is positioned on the steering wheel, several concepts have been developed. One concept relies on the EPS system and induces a low-amplitude vibration in the steering wheel. If the hands of the driver are on the steering wheel, this has a dampening effect which can be detected. However, the vibration can be distracting or disturbing to the driver. Other systems use dedicated sensors. One such system uses resistive sensor elements where two conductors are disposed spaced apart under the surface of the steering wheel. If a certain pressure is exerted on the surface, the conductors are brought into contact. However, the amount of pressure required to activate the sensor makes this approach less reliable. Another approach uses capacitive sensors, which detect a hand by its influence on an electric field generated by the sensor. While these sensors are more reliable, they considerably increase the complexity of the steering wheel. This is in particular true if the position of the hand is to be detected, which makes it necessary to provide a plurality of sensors, i.e. one for each surface position, along with detection circuitry for each individual sensor. This complexity increases the costs and makes the system more prone to failure.

SUMMARY

It is thus an object of the present invention to provide means for hand detection on a steering wheel which are reliable and have a low complexity. Another object, to be solved at least by embodiments of the invention, is to detect position and movements of one or two hands over the steering wheel for HMI applications.

This problem is solved by a system and method for hand detection on a steering wheel according to the claims.

The invention relates to a system for hand detection on a steering wheel. "Hand detection on a steering wheel" in general refers to detecting whether at least one hand of a user is on a steering wheel.

The system comprises a signal line extending from a first point to a second point and being disposed along at least a portion of a surface of a steering wheel. The signal line can be any kind of electrical conductor, e.g. a wire or a conductor path on a printed circuit board or on a flexible substrate. In general, the first and second point do not have to be the physical ends of the signal line but are referenced points along the signal line. The signal line is disposed along at least a portion of the surface of the steering wheel. Normally, it is disposed underneath some isolating lining that forms the physical surface of the steering wheel, which is designed to be touched by a user. In particular, the portion of the steering wheel along which the signal line is disposed can be part of an outer rim or edge of the steering wheel. In general, this will be a surface that is designed for being touched by at least one hand of a user during normal operation of the steering wheel. Preferably, the first and second points are disposed spaced apart along the circumference of the steering wheel. The steering wheel of course belongs to a vehicle, normally a land vehicle like a car. However, application to other vehicles like sea or air vehicles is also within the scope of the invention. It is understood that the shape of the steering wheel does not have to be circular but may e.g. be oval or correspond to only part of a full circle.

The system further comprises a detection unit coupled to the first point, wherein the detection unit is configured to send a time-dependent detection signal traveling along the signal line, receive a reflected signal traveling along the signal line and detect the presence of a hand on the surface based on the reflected signal. The detection unit may e.g. comprise a signal generator, an amplifier, an analogue-to-digital converter, a transceiver, a processing unit and other components necessary for carrying out the described functions. It is understood that the detection unit may at least partially be software-implemented. The detection unit is coupled to the first point, which means that it is electrically coupled, but not necessarily conductingly coupled. For example, the coupling may be achieved via an electric and/or magnetic field. Either way, the detection unit is configured to send a detection signal (via the first point) over the signal line. Of course, the detection signal and other signals mentioned hereinafter are electrical signals. The detection signal is time-dependent, i.e. it changes over time, which includes the possibility that it remains constant for certain time periods.

The detection signal comprises in general an electromagnetic wave which has electrodynamic properties and which can be reflected by transmission lines discontinuities. The detection signal travels along the signal line from the first point towards the second point. In general, a part of the detection signal is reflected, thus forming the reflected signal, which travels in the opposite direction. Propagation of the respective signals along the signal line depends on the (local) impedance of the signal line. Any change of the impedance gives rise to a reflection. For instance, if a hand of a user (driver, pilot etc.) is in the proximity of the signal line, this influences the local impedance, wherefore a part of the detection signal is reflected, thus contributing to the reflected signal. Depending on the embodiment, it is conceivable that the reflected signal is (almost) zero if no hand is present. The detection unit is configured to receive the reflected signal (normally via the first point) and to detect the presence of a hand (i.e. at least one hand) on the surface based on the reflected signal. This detection is not to be construed in a limiting way in that the detection unit is able to distinguish a hand from any other object in all cases. Rather, this means that if a hand is on the surface, this is detected by the detection unit. In some embodiments, the hand may be detected even though it is not on the surface but at a very short distance from the surface. The length of such distance, i.e. the "detection threshold", depends on several factors like the shape of the detection signal, the geometry of the signal line, its distance to the surface of the steering wheel, and so on. In its most simple form, the detection unit is only configured to detect whether or not a hand is on the surface.

In general, hand detection according to the invention is based on a time-domain reflectometry (TDR) measurement. In a very simple embodiment, the detection unit could detect the presence of a hand by comparing the reflected signal with a "calibration signal", i.e. a reflected signal corresponding to no hand positioned on the steering wheel. If the difference between the actual reflected signal and the calibration signal is above a certain threshold, this can be interpreted as the presence of at least one hand. As will be explained below, however, it is preferred that analysis of the reflected signal is more detailed. In any case, the hardware required for a detection according to the invention is relatively simple. In particular, the signal line can be manufactured at low cost and can be relatively robust.

According to a preferred embodiment, the system comprises a ground structure connected to ground and an isolator disposed to isolate the signal line from the ground structure between the first and second point. The ground structure can be e.g. a metal frame of the steering wheel, a metal foil disposed underneath an isolating substrate of the signal line or it may be some kind of conducting line that is physically similar to the signal line. It is understood that the presence of the ground structure influences the impedance of the signal line by defining a "zero" potential. The ground structure is isolated from the signal line (at least) between the first and second point in order to prevent any short circuit. This, of course, refers to the normal, i.e. undamaged, state of the system.

According to one embodiment, the second point is connected to an electrical terminator. Such an electrical terminator has an impedance at least similar to the impedance of the signal line, thereby minimizing or suppressing reflections as long as no hand (or other object) is present near the surface. It may also be referred as a termination impedance. Although active termination is within the scope of the invention, passive termination is preferred since it may be achieved at a lower cost and with more robust elements. For instance, the electrical terminator may be a resistor. In particular, the second point may be connected to the ground structure via the electrical terminator.

It is highly preferred that the detection unit is configured to determine a position of the hand based on the reflected signal. In other words, the detection unit cannot only detect whether a hand is on the surface but also in which part of the surface. For example, if the signal line is disposed along the circumference of the steering wheel, the detection unit may be configured to determine an angular position of the hand. Depending on the nature of the detection signal, various approaches can be employed to determine the position.

It is also preferred that the detection unit is configured to determine positions of two hands on the surface based on the reflected signal. This is possible because even if a part of the detection signal is reflected at the position of one hand due to the changing impedance, another part is transmitted and continues to travel towards the second point. If another discontinuity in the impedance is encountered, this signal is again split into a reflected part and a transmitted part. Therefore, the total reflected signal contains information on both reflections and thus on the location of the two hands.

In general, the detection signal could be any kind of time-dependent signal. In particular, it may be a pulse signal. In this embodiment, the detection unit normally sends a single pulse, e.g. a square pulse, which is followed by a pause before the next pulse is sent. In order to avoid ambiguities, the pause is normally long enough to allow the detection signal to travel from the first point to the second point and a reflected signal to travel back again to the first point. The position of the hand is determined by measuring the time period between sending the pulse through the first point and receiving a reflected pulse at the first point, or, in other words, the time-of-flight. If two reflections occur due to two hands being on the surface, two time periods are measured. It is also conceivable to send a series of pulses instead of a single pulse.

Apart from using a pulse signal, it is also possible to use a continuous signal. For instance, the detection signal may be a frequency swept sine signal. In such a case, the detection unit may be configured to perform an FFT (fast Fourier transformation) on the reflected signal. Another possibility is to use a pseudo random phase-shift keyed signal or a pseudo random signal, in which case the detection unit can be configured to perform a cross correlation between the detection signal and the reflected signal. The operation is the same as in the 'phase radar' where the same signal is sent and received and processed.

Preferably, the signal line is disposed along the surface in a meandering shape. This also applies if only a one-dimensional position of the hand needs to be determined. Normally, it is sufficient to determine an angular (i.e. one-dimensional) position of the hand along the circumference of the steering wheel. However, if the signal line is disposed in a straight manner, its total length between the first and second point may be rather short and the same applies to the time-of-flight of the detection signal and the reflected signal. Therefore, a very high time resolution would be necessary to accurately determine the position of the hand. If the signal line is disposed in a meandering shape, the total length increases and thus the time-of-flight. Therefore the necessary time resolution is reduced. Furthermore, if a meandering shape is used, the hand is disposed in the proximity of a bigger portion of the signal line, wherefore the influence on the impedance (and thus on the reflected signal) is bigger. Thus, the detection sensitivity can be increased.

Apart from increasing the length of the signal line, the time-of-flight of the signals can also be influenced by using a material with a high relative permeability as the above-mentioned isolator. By this measure, the signals are slowed down.

Apart from determining the position of the hand, the detection unit may be configured to determine an intensity of contact between the hand and the surface based on the reflected signal. If the user only places his hand loosely on the steering wheel, the effect on the impedance is less than if he firmly grasps the steering wheel. This is mostly due to the fact that in the first case, only a relatively small portion of the surface will be in direct contact with the hand, whereas in the second case, this portion will be larger. It is understood that direct contact with the surface corresponds to the closest possible proximity to the signal line and thus to the biggest impact on the impedance. Therefore, by analyzing the shape and/or the intensity of the reflected signal, it is possible to at least approximately determine the intensity of contact.

Apart from detecting the presence of at least one hand, the detection unit may perform a diagnosis of the signal line. For example, it can be adapted to determine an intact length of the signal line based on the reflected signal. In this context, "intact length" refers to the length of the portion of the signal line that is neither interrupted nor short-circuited. For example, if the signal line is interrupted, i.e. broken, between the first point and the second point, such interruption will result in an unexpected reflection, which can be identified by the detection unit. Normally, the shape of the reflected signal differs from reflected signals due to the presence of a hand. Even if not so, the diagnosis may be performed during a time when no hands can be expected on the steering wheel, e.g. when the driver seat is not occupied. A short circuit can be detected e.g. by analyzing the height of a reflected pulse. Normally, the reflected pulse due to a short circuit is higher than any reflected pulse due to the presence of a hand.

According to one embodiment, a reference line extends from a third point to a fourth point and is disposed along the surface alongside the signal line, wherein the detection unit is configured to send over the reference line a reference signal, which is complementary to the detection signal. The reference line can be designed similar to the signal line, e.g. both lines can be wires or conductor paths on a printed circuit board. Like the first and second points, the third and fourth points are not necessarily the physical ends of the reference line, but are to be understood as reference points. The reference line is disposed alongside the signal line, which means that the course of the reference line generally corresponds to the signal line. The reference signal which is sent over the reference line is complementary to the detection signal, which means that the reference signal corresponds to the negative of the detection signal. Normally, it is ambiguous which line is the signal line and which is the reference line. In this embodiment, the system works in a differential mode. It is understood that the reference signal in general gives rise to a reference reflected signal, which is approximately the negative of the reflected signal, if the length and the course of the reference line does not differ significantly from the signal line. If, however, some external interference affects the reflected signal, this interference normally affects the reference reflected signal in the same way, wherefore the difference between both signals remains unchanged. By taking into account the difference of both reflected signals, the detection unit can detect the presence of a hand and its position with higher reliability. Also, it may be easier to detect breaks or short circuits, since these normally do not affect both the signal line and the reference line at the same time. Therefore any failure of only one line leads to inconsistent measurements. If a reference line is used, the second point is normally connected to the fourth point, for example via an electrical terminator or directly (in which case the second and fourth point can also be considered identical). If such a connection is present, it may be unnecessary to connect the second point to ground.

In some embodiments of the invention, there is no need for dedicated circuitry in the steering wheel. Rather, it is possible to use a heating wire of a heating system as the signal line and/or reference line. According to such an embodiment, least one of the signal line and the reference line is connected to a heating power source for heating the steering wheel. One might also say that at least one of the signal line and the reference line is formed by a heating wire of the steering wheel. This embodiment is highly advantageous in that it requires minimal changes with respect to a "conventional" steering wheel having only a heating function. The detection unit only needs to be coupled to the existing heating wire.

In order to decouple the at least one of the signal line and the reference line is connected to the heating source via a decoupling device.

If the signal line and/or the reference line is part of a heating wire, the detection unit could be affected by the influence of the heating source if it is connected conductingly to the first or third terminal. This can be avoided by connecting a decoupling device such as a common-mode choke or two separate chokes or coils between the heating source and the heating circuit or hearting wire which operates as one of the signal line and the reference line. It will be noted, that in case of a differential operating mode, a common mode choke is not the correct decoupling device, as it suppresses differential currents. In this case, two separate chokes have to be used. Furthermore, the detection signal and the reference signal are preferably coupled to the respective lines via a respective capacitor. The same applies to the received reflected signals. It is understood that the direct current components of the heating current are not transferred.

If the signal line and the reference line or part of a heating wire, it is normally not possible to connect the second and fourth point by a resistor as an electrical terminator, because this would decrease the heating current in an unacceptable way. This problem can be solved according to one embodiment in which the electrical terminator comprises an inductance connected in parallel to a resistor. Of course, other (active or passive) terminators may be used that will not excessively increase the resistance.

The invention also provides a method for hand detection on a steering wheel, with a signal line extending from a first point to a second point and being disposed along at least a portion of a surface of a steering wheel. The method comprises: sending a time-dependent detection signal traveling along the signal line; receiving a time-dependent reflected signal traveling along the signal line; and detecting the presence of a hand on the surface based on the reflected signal. Of course, these method steps can be performed by a detection unit as described above with reference to the inventive system. All these terms have been described above and will therefore not be explained again.

Preferred embodiments of the inventive method correspond to those of the inventive system.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
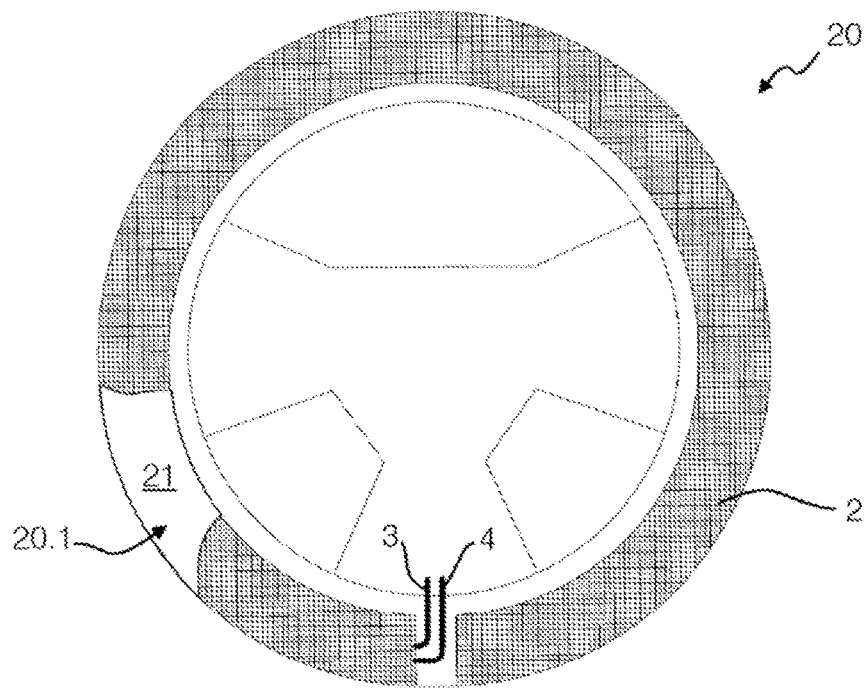
FIG. 1 is a schematic view a steering wheel with components of an inventive system for hand detection on a steering wheel.

FIG. 1 schematically shows a steering wheel 20 for a vehicle, normally a road vehicle. A circumferential surface 20.1 of the steering wheel has an electrically isolating lining 21, which also serves aesthetic and ergonomic purposes. Under the lining 21, which is mostly omitted in FIG. 1, lies a flat sensor field 2 which is partially wrapped around the steering wheel 30. The sensor field 2 can be connected to one or two connecting lines 3, 4, by which it is coupled to a detection unit 9 that will be described below. It should be noted that in some embodiments, only one connecting line 3, 4 is necessary, with the sensor field 2 being connected to a ground structure 8, e.g. a metal frame of the steering wheel. The sensor field 2 is part of an inventive system 1 for hand detection on a steering wheel, embodiments of which will be described with respect to FIGS. 2 to 5.

Figure 2:
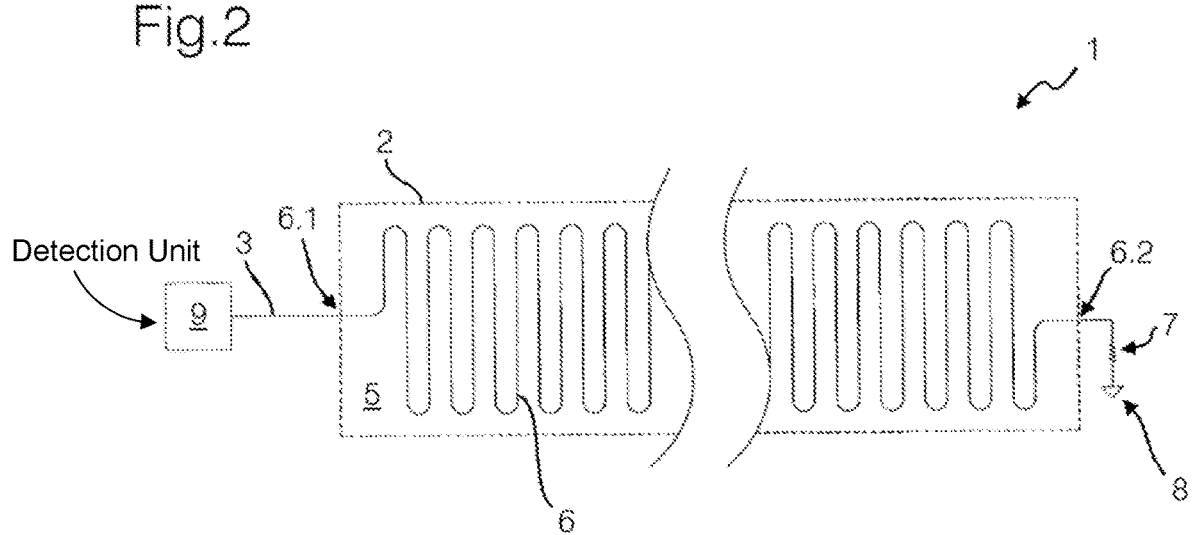
FIG. 2 is a schematic view of a first embodiment of an inventive system.

FIG. 2 shows a first embodiment of the system 1. It should be noted that a horizontal position in the sensor field 2 as shown in FIG. 2 corresponds to an angular position in FIG. 1. The sensor field 2 has an electrically isolating substrate 5 on which a signal line 6 is disposed. The substrate 5 may be a flexible foil and the signal line 6 may be a conductor path on its surface. The signal line 6 extends from a first point 6.1 to a second point 6.2 in a meandering shape. The second point 6.2 is connected to a ground structure 8 (e.g. the metal frame of the steering wheel 30 or a metal foil disposed underneath the substrate 5) via a resistor 7 which serves as a electrical terminator. Although not shown in this schematic representation, the ground structure 8 may be disposed underneath the substrate 5, which serves to electrically isolate the signal line 6 from the ground structure 8. It should be noted that the resistor 7 and the connection to the ground structure 8 are optional and the second point 6.2 could remain unconnected. The first point 6.1 is connected by the connecting line 3 to the detection unit 9.

During operation, the detection unit 9 sends a time-dependent detection signal over the signal line 6. For instance, the detection signal may be a pulse signal, i.e. the detection unit 9 sends a pulse which is followed by a pause before the next pulse is sent. The pulse propagates from the first point 6.1 over the signal line 6 to the second point 6.2 and is ideally absorbed in the resistor 7 (if present). Signal line 6 (together with ground structure 8) can be characterized by a characteristic impedance to which the resistor 7 is matched. If, however, the driver places a hand on the surface 20.1, its proximity to the signal line 6 causes a local change or discontinuity in the characteristic impedance. This discontinuity causes a part of the pulse to be reflected back towards the first point 6.1. This reflected signal is received by the detection unit 9 via the first point 6.1 and the connecting line 3.

By measuring the delay between the emitted pulse and the reflected pulse, the detection unit 9 determines the position of the hand. The same principle applies if two hands are placed on the surface 20.1. In this case, two pulses will be reflected. In order to avoid ambiguities, the time interval between two consecutive emitted pulses should be longer than the time-of-flight of a pulse from the detection unit 9 to the second point 6.1 and back again. The spatial resolution with which the position of the hand can be detected is limited by the time resolution with which the delay between the emitted pulse and the reflected pulse can be measured. Therefore, the resolution is improved by the meandering shape, which increases the time-of-flight of the signals along the signal line 6. The meandering shape also helps to increase the sensitivity of the sensor field 2, as a hand will be in proximity of a larger part of the signal line 6 compared to a straight wire. Additionally, the width of the received pulse is an indication of the grip strength of the hand on the steering wheel. Another way to increase the time-of-flight is to use a material with a high relative permeability for the substrate 5.

If the resistor 7 is not present or is not matched to the characteristic impedance of the combination of signal line 6 and the ground structure 8, the pulse will be partially reflected even if no hand is present. By measuring the delay between the emitted pulse and this reflected pulse, and intact length of the signal line 6 can be measured. The detection unit 9 may optionally perform a diagnostics of the signal line 6 during a time when no hands can be expected on the steering wheel, e.g. when the driver seat is unoccupied. If the delay is shorter than an expected value corresponding to an intact signal line 6, this can be interpreted as a break in signal line 6. Also, a short circuit between signal line 6 and the ground structure 8 or other surrounding conductive elements (for example a nearby heating wire) can be detected by evaluating the height of the reflected pulse. If the height of the pulse exceeds a certain threshold, this can be interpreted as a short circuit.

The time-dependent detection signal does not need to be a pulse signal but it can be a continuous signal as well. For example, it may be a frequency swept sine wave, in which case the detection unit 9 performs an FFT on the reflected signal. Another possibility is that the detection signal is a pseudo random phase-shift keyed signal or a pseudo random signal, in which case the detection unit 9 performs a cross correlation between the generated signal and the reflected signal.

Figure 3:
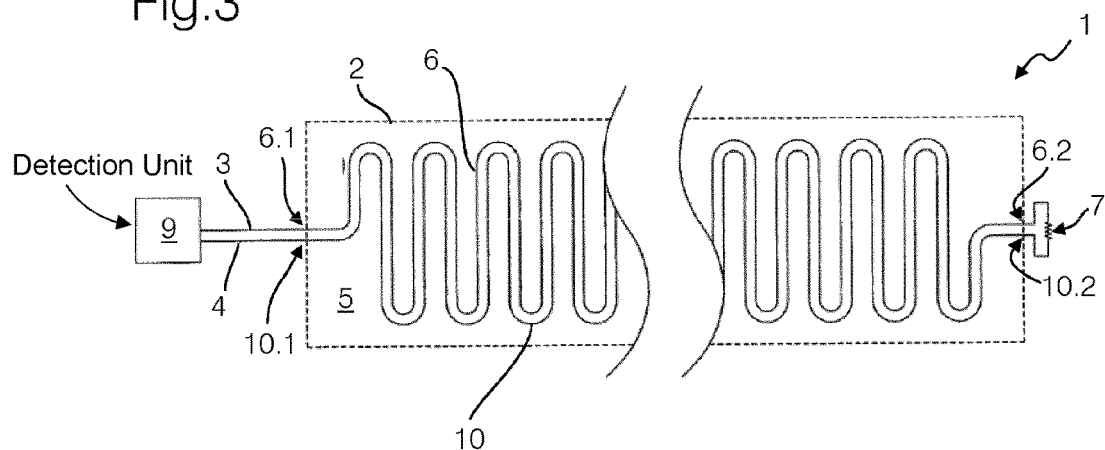
FIG. 3 is a schematic view of a second embodiment of an inventive system.

FIG. 3 shows a second embodiment of an inventive system 1, which is largely similar to the one shown in FIG. 2 and insofar will not be explained again. However, in addition to the signal line 6, a second line 10 extends between a third point 10.1 and a fourth point 10.2 alongside the signal line 6. Like the signal line 6, the second line 10 can be a conductor path on the substrate 5. The second line 10 is connected via a connection line 4 to the detection unit 9. According to one option, the connection line 4 is connected to ground (via the detection unit 9) which would make the second line 10 a ground structure. According to another option, the detection unit 9 sends a reference signal over the second line 10 which is complementary to the detection signal, i.e. it has opposite polarity. While the first option can be described as a single ended mode, the second option can be described as a differential mode. Since the signal line 6 and the second line 10 are disposed alongside each other, the presence of a hand leads to a reflection in both lines 6, 10. Under normal circumstances, the detection unit 9 receives a reflected signal and a reference reflected signal which only differ by polarity. However, if the lines 6, 10 are affected by an external disturbance, this normally creates an equal offset in both reflected signals and does not affect the difference of both signals. Therefore, if the difference is evaluated by the detection unit 9, this makes the measurements more reliable. FIG. 3 shows the second point 6.2 and the fourth point 10.2 connected by a resistor 7. However, the use of this resistor 7 as an electrical terminator is only optional.

Figure 4:
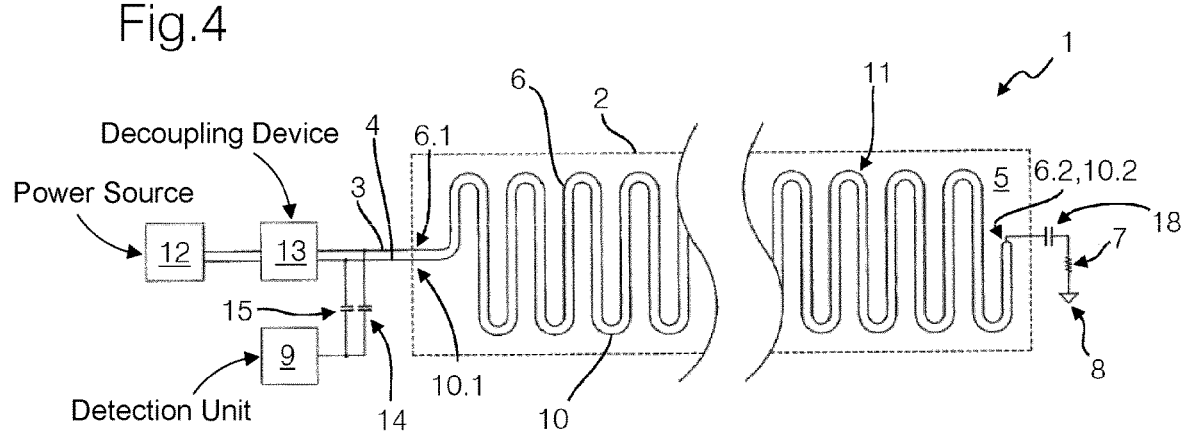
FIG. 4 is a schematic view of a third embodiment of an inventive system.

While the embodiments in FIGS. 2 and 3 use dedicated lines 6, 10 to implement the sensor field 2, FIG. 4 shows a third embodiment which uses a heating wire 11 to heat the steering wheel 20 and to detect hands at the same time. In effect, both the signal line 6 and the second line 10 are parts of the heating wire 11. Both lines 6, 10 are connected to a heating power source 12, for example a heater ECU, via the connection lines 3, 4 and a decoupling device 13 that is used to decouple the measurement by the detection unit 9 from the heating power source 12. The decoupling device 13 can for example be a common-mode choke. The heating wire is operated in common mode, that is, the same potential is present on the forward and return heating wires. This implies that the coupling from the heating wires to the detection unit can be done by one of two capacitors. The detection unit 9 is therefore coupled to the first point 6.1 and the third point 10.1 via respective coupling capacitors 14 and 15, by which it is decoupled from the heating current. The system 1 is configured for single ended mode. The heating wire is operated in common mode, that is, the same potential is present on the forward and return heating wires. This implies that the coupling from the heating wires to the detection unit can be done by one of two capacitors. It should be noted that the connection of the second and fourth point 6.2, 10.2 to a ground structure 8 via a resistor 7 is optional. Finally the circuit in FIG. 4 further comprises a series capacitor 18 in series with the resistance 7. In fact, the resistance is driven by half the heating voltage thereby generating dissipated power in the resistance 7. If this dissipated power is too large, an additional series 18 capacitor is required.

Instead of using the capacitor 14 to couple the detection unit 9 to the signal line 6, it is also possible to add a third winding to the common mode choke 13 and connect the detection unit 9 to this third winding.

Figure 5:
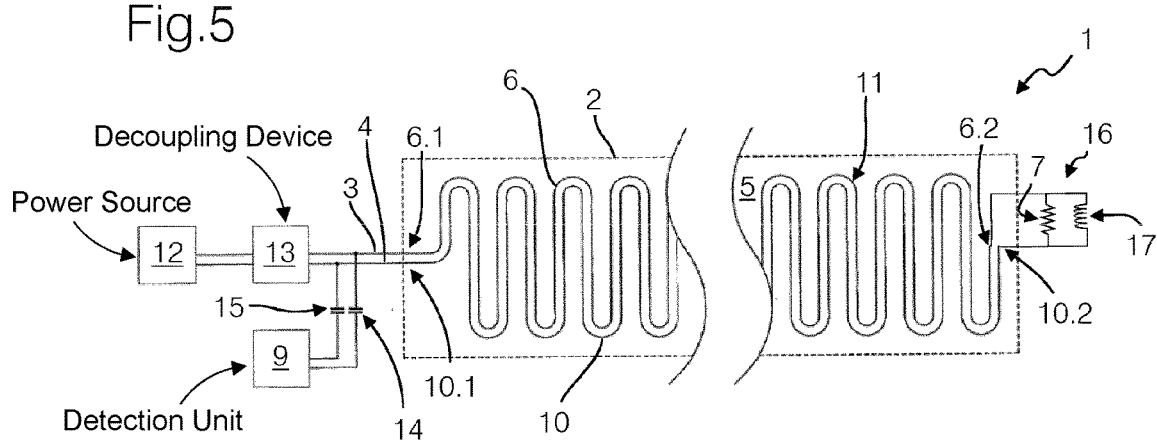
FIG. 5 is a schematic view of a fourth embodiment of an inventive system.

FIG. 5 shows a fourth embodiment of an inventive system 1, which is similar to the third embodiment. However, the system 1 is configured for a differential measurement mode. The detection unit 9 couples a detection signal and a reference signal via coupling capacitors 14, 15 into the signal line 6 and the reference line 10. Decoupling device 13 again decouples these signals from the heating power source 12, but as these signals are complementary, a common mode choke would short-circuit. A possible solution is to use two separate coils for decoupling.

It is not possible to connect the second point 6.2 and the fourth point 10.2 only by a resistor 7, because its resistance would render the heating current too small. One option is to use now electrical terminator at all, while another option is to use an electrical terminator 16 which comprises an inductance 17 connected in parallel to a resistor 7.

The invention claimed is:

1. A system for hand detection on a steering wheel, comprising:
    a signal line extending from a first point to a second point and being disposed along at least a portion of a surface of the steering wheel; and
    a detection unit coupled to the first point;
    wherein the detection unit is configured to send a time-dependent detection signal traveling along the signal line, receive a reflected signal traveling along the signal line and detect the presence of a hand on the surface based on the reflected signal.

2. The system according to claim 1, wherein the system comprises:
    a ground structure connected to ground; and
    an isolator disposed to isolate the signal line from the ground structure between the first and second point.

3. The system according to claim 1, wherein the second point is connected to an electrical terminator.

4. The system according claim 3, wherein the electrical terminator comprises an inductance connected in parallel to a resistor.

5. The system according to claim 1, wherein the detection signal is a pulse signal, a frequency swept signal or a pseudo random phase-shift keyed signal or a pseudo random signal.

6. The system according to claim 1, wherein the detection unit is configured to determine a position of the hand based on the reflected signal.

7. The system according to claim 1, wherein the detection unit is configured to determine positions of two hands on the surface based on the reflected signal.

8. The system according to claim 1, wherein the signal line is disposed along the surface in a meandering shape.

9. The system according to claim 1, wherein the detection unit is configured to determine an intensity of contact between the hand and the surface based on the reflected signal.

10. The system according to claim 1, wherein the detection unit is adapted to determine an intact length of the signal line based on the reflected signal.

11. The system according to claim 1, wherein a reference line extends from a third point to a fourth point and is disposed along the surface alongside the signal line, wherein the detection unit is configured to send over the reference line a reference signal, which is complementary to the detection signal.

12. The system according to claim 11, wherein at least one of the signal line and the reference line is connected to a heating power source for heating the steering wheel.

13. The system according to claim 12, wherein the at least one of the signal line and the reference line is connected to the heating power source via a decoupling device.

14. The system according to claim 11, wherein the detection unit is coupled to at least one of the signal line and the reference line via a capacitor.

15. A method for hand detection on a steering wheel, with a signal line extending from a first point to a second point and being disposed along at least a portion of a surface of the steering wheel, the method comprising:
    sending a time-dependent detection signal traveling along the signal line;
    receiving a time-dependent reflected signal traveling along the signal line; and
    detecting the presence of a hand on the surface based on the reflected signal.

* * * * *